(12) United States Patent
Chen et al.

(10) Patent No.: US 12,676,449 B2
(45) Date of Patent: Jul. 7, 2026

(54) SEMICONDUCTOR PACKAGE HAVING GROUND BONDING WIRE THAT CROSSES OVER SIGNAL BONDING WIRE FOR CROSSTALK REDUCTION AND ASSOCIATED METHOD

(71) Applicant: Airoha Technology Corp., Hsinchu City (TW)

(72) Inventors: Chun-Wei Chen, Hsinchu County (TW); Ming-Yin Ko, Hsinchu County (TW); Yan-Bin Luo, Taipei City (TW)

(73) Assignee: Airoha Technology Corp., Hsinchu City (TW)

( * ) Notice: Subject to any disclaimer, the term of this patent is extended or adjusted under 35 U.S.C. 154(b) by 861 days.

(21) Appl. No.: 18/070,406

(22) Filed: Nov. 28, 2022

(65) Prior Publication Data

US 2023/0402818 A1 Dec. 14, 2023

Related U.S. Application Data

(60) Provisional application No. 63/350,025, filed on Jun. 8, 2022.

(51) Int. Cl.
| | |
|---|---|
| *H01S 3/00* | (2006.01) |
| *H01S 5/02* | (2006.01) |
| *H01S 5/02315* | (2021.01) |
| *H01S 5/02345* | (2021.01) |
| *H01S 5/02355* | (2021.01) |

(Continued)

(52) U.S. Cl.
CPC ........ *H01S 5/02345* (2021.01); *H01S 5/0215* (2013.01); *H01S 5/02315* (2021.01); *H01S 5/02355* (2021.01); *H01S 5/0261* (2013.01); *H01S 5/183* (2013.01)

(58) Field of Classification Search
CPC .............. H01S 5/02345; H01S 5/0215; H01S 5/02315; H01S 5/02355; H01S 5/0261; H01S 5/183; H01S 5/0239; H01S 5/06226; H01S 5/423
See application file for complete search history.

(56) References Cited

U.S. PATENT DOCUMENTS

| | | | | |
|---|---|---|---|---|
| 7,683,480 | B2 * | 3/2010 | Bokatius | ................. H01L 23/66 257/E23.141 |
| 10,547,158 | B1 * | 1/2020 | McColloch | ........... H01S 5/0268 |
| 2005/0063642 | A1 | 3/2005 | Gallup | |

(Continued)

FOREIGN PATENT DOCUMENTS

| | | |
|---|---|---|
| CN | 109417272 A | 3/2019 |
| CN | 111458811 A | 7/2020 |

(Continued)

*Primary Examiner* — Kinam Park
(74) *Attorney, Agent, or Firm* — Winston Hsu

(57) ABSTRACT

A semiconductor package includes a printed circuit board (PCB), a semiconductor device, a first signal bonding wire, and a first ground bonding wire. The PCB includes a first PCB ground pad and a first PCB signal trace. The semiconductor device includes a first device ground pad and a first device signal pad. The first signal bonding wire is coupled between the first device signal pad and the first PCB signal trace. The first ground bonding wire is coupled between the first device ground pad and the first PCB ground pad, wherein the first ground bonding wire crosses over the first signal bonding wire.

20 Claims, 4 Drawing Sheets

(51) Int. Cl.
*H01S 5/026* (2006.01)
*H01S 5/183* (2006.01)

(56) References Cited

U.S. PATENT DOCUMENTS

2012/0018862 A1\*  1/2012  Chen ................. H01L 23/49541
                                                257/670
2013/0114629 A1    5/2013  Firth
2017/0207146 A1\*  7/2017  Ouyang .................. H01L 24/49
2021/0226413 A1\*  7/2021  Yi ........................ H01S 5/02212
2023/0054034 A1\*  2/2023  Chua ....................... H01S 5/423

FOREIGN PATENT DOCUMENTS

CN      112235932  A    1/2021
TW      201711151  A    3/2017

\* cited by examiner

202

204

118_0     114_0

202

204

118_0     114_0     118_1     114_1     118_2     114_2     118_3     114_3

SEMICONDUCTOR PACKAGE HAVING GROUND BONDING WIRE THAT CROSSES OVER SIGNAL BONDING WIRE FOR CROSSTALK REDUCTION AND ASSOCIATED METHOD

CROSS REFERENCE TO RELATED APPLICATIONS

This application claims the benefit of U.S. Provisional Application No. 63/350,025, filed on Jun. 8, 2022. The content of the application is incorporated herein by reference.

BACKGROUND OF THE INVENTION

1. Field of the Invention

The present invention relates to a crosstalk reduction technique, and more particularly, to a semiconductor package having a ground bonding wire that crosses over a signal bonding wire for crosstalk reduction and an associated method.

2. Description of the Prior Art

A vertical-emitting optical device, such as a vertical-cavity surface-emitting laser (VCSEL), is a laser in which a laser beam is emitted in a direction perpendicular to a surface of a substrate. A VCSEL array may provide multiple emitting sources on a single chip for emitting a single beam or multiple discrete beams. Regarding packaging of the VCSEL array, a wire bonding process is typically used to connect an anode pad and a cathode pad of each VCSEL to a signal trace and a ground pad on a printed circuit board (PCB). When a driverless optical module is implemented using the VCSEL array, electromagnetic interference (EMI) introduced by a signal passing through a signal bonding wire of a VCSEL in the VCSEL array may be coupled to a signal passing through a signal bonding wire of another VCSEL in the same VCSEL array, which increases the crosstalk level of the driverless optical module and results in system performance degradation. Thus, there is a need for an innovative semiconductor package (e.g., an optical package) with a crosstalk reduction design.

SUMMARY OF THE INVENTION

One of the objectives of the present invention is to provide a semiconductor package having a ground bonding wire that crosses over a signal bonding wire for crosstalk reduction and an associated method.

According to a first aspect of the present invention, an exemplary semiconductor package includes a printed circuit board (PCB), a semiconductor device, a first signal bonding wire, and a first ground bonding wire. The PCB includes a first PCB ground pad and a first PCB signal trace. The semiconductor device includes a first device ground pad and a first device signal pad. The first signal bonding wire is coupled between the first device signal pad and the first PCB signal trace. The first ground bonding wire is coupled between the first device ground pad and the first PCB ground pad, wherein the first ground bonding wire crosses over the first signal bonding wire.

According to a second aspect of the present invention, an exemplary method for fabricating a semiconductor package is disclosed. The exemplary method includes: mounting a semiconductor device on a printed circuit board (PCB), wherein the PCB comprises a first PCB ground pad and a first PCB signal trace, and the semiconductor device comprises a first device ground pad and a first device signal pad; and performing a wire bonding process for coupling a first signal bonding wire between the first device signal pad and the first PCB signal trace and coupling a first ground bonding wire between the first device ground pad and the first PCB ground pad, wherein the first ground bonding wire crosses over the first signal bonding wire.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
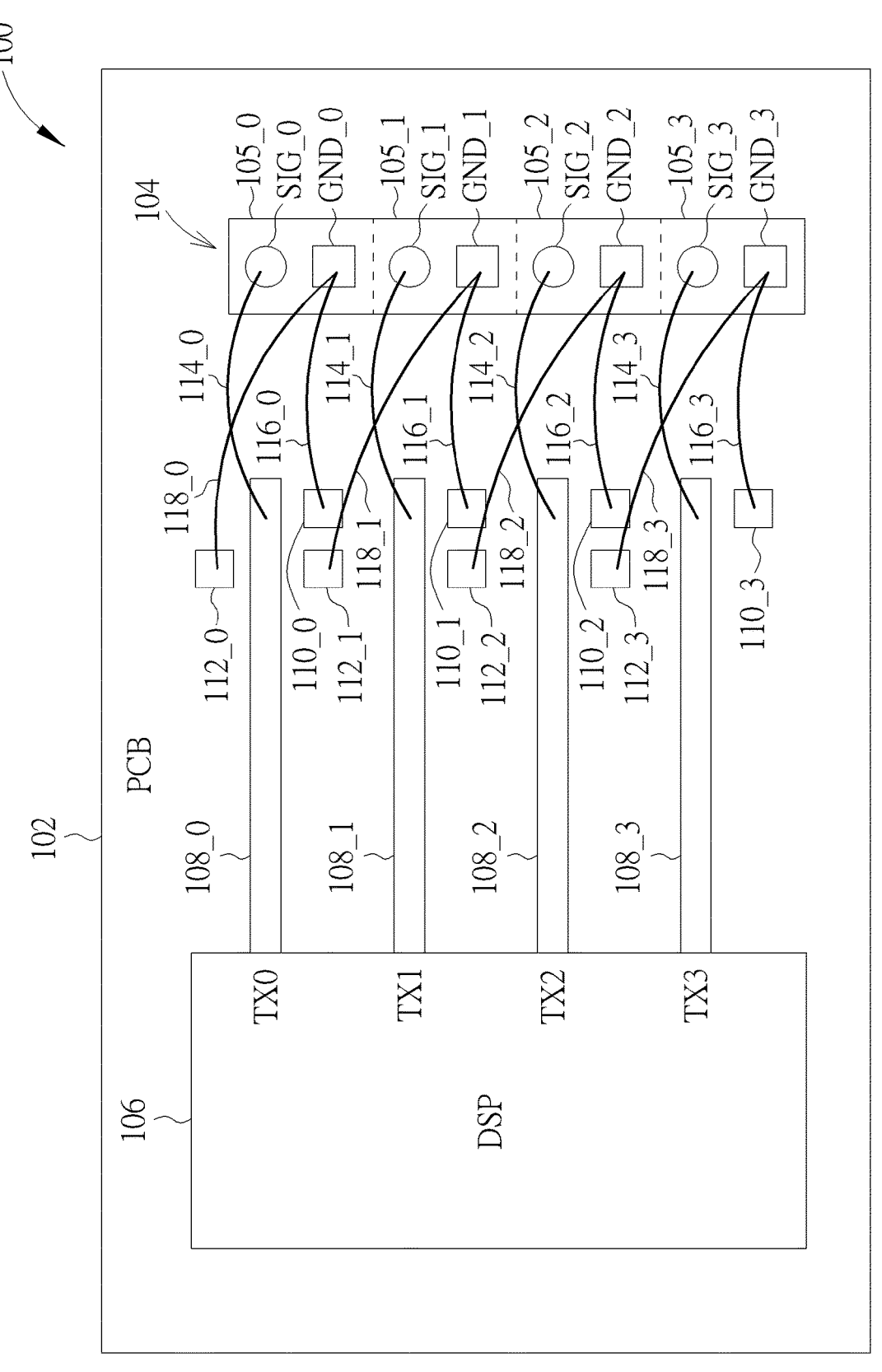
FIG. 1 is a diagram illustrating a semiconductor package with a proposed crosstalk reduction design according to an embodiment of the present invention.

FIG. 1 is a diagram illustrating a semiconductor package with a proposed crosstalk reduction design according to an embodiment of the present invention. The semiconductor package 100 incudes a printed circuit board (PCB) 102, a semiconductor device 104, and a digital signal processor (DSP) 106. The semiconductor device 104 is mounted on the PCB 102, and includes a plurality of semiconductor components 105_0, 105_1, 105_2, 105_3. In some embodiments of the present invention, the semiconductor device 104 may be an optical device. For example, the semiconductor device 104 may be a vertical cavity surface emitting laser (VCSEL) array, where each of the semiconductor components 105_0-105_3 is one VCSEL. The DSP 106 is mounted on the PCB 102, and is arranged to drive the semiconductor device 104.

As shown in FIG. 1, the DSP 106 has a plurality of output ports TX0, TX1, TX2, TX3 that are connected to a plurality of PCB signal traces 108_0, 108_1, 108_2, 108_3, respectively. In this embodiment, the semiconductor device 104 may be a driverless device such as a driverless optical device using VCSELs. Hence, the semiconductor device 104 is directly driven by the DSP 106 without via additional driver circuits located between the DSP 106 and the semiconductor device 104. However, this is for illustrative purposes, and is not meant to be a limitation of the present invention. In practice, any semiconductor package using the proposed crosstalk reduction design falls within the scope of the present invention.

As shown in FIG. 1, each of the semiconductor components 105_0-105_3 has a device signal pad SIG_0/SIG_1/SIG_2/SIG_3 and a device ground pad GND_0/GND_1/GND_2/GND_3. Since the semiconductor device 104 is a driverless device in this embodiment, the device signal pad (e.g., anode pad) SIG_0 of the semiconductor component (e.g., VCSEL) 105_0 is electrically connected to the PCB signal trace 108_0 through a signal bonding wire 114_0, the device signal pad (e.g., anode pad) SIG_1 of the semiconductor component (e.g., VCSEL) 105_1 is electrically connected to the PCB signal trace 108_1 through a signal bonding wire 114_1, the device signal pad (e.g., anode pad) SIG_2 of the semiconductor component (e.g., VCSEL) 105_2 is electrically connected to the PCB signal trace 108_2 through a signal bonding wire 114_2, the device signal pad (e.g., anode pad) SIG_3 of the semiconductor component (e.g., VCSEL) 105_3 is electrically connected to the PCB signal trace 108_3 through a signal bonding wire 114_3, the device ground pad (e.g., cathode pad) GND_0 of the semiconductor component (e.g., VCSEL) 105_0 is electrically connected to the PCB ground pad 110_0 through a ground bonding wire 116_0, the device ground pad (e.g., cathode pad) GND_1 of the semiconductor component (e.g., VCSEL) 105_1 is electrically connected to the PCB ground pad 110_1 through a ground bonding wire 116_1, the device ground pad (e.g., cathode pad) GND_2 of the semiconductor component (e.g., VCSEL) 105_2 is electrically connected to the PCB ground pad 110_2 through a ground bonding wire 116_2, and the device ground pad (e.g., cathode pad) GND_3 of the semiconductor component (e.g., VCSEL) 105_3 is electrically connected to the PCB ground pad 110_3 through a ground bonding wire 116_3. To put it simply, the manufacture process of the semiconductor package 100 includes mounting the semiconductor device 104 on the PCB 102, and performing a wire bonding process to form the signal bonding wires and the ground bonding wires between the semiconductor device 104 and the PCB 102.

Furthermore, since the semiconductor device 104 is a driverless device in this embodiment, a driving signal passing through a signal bonding wire of one semiconductor component is subject to electromagnetic interference (EMI) introduced by a driving signal passing through a signal bonding wire of another semiconductor component. To address this crosstalk issue, the present invention proposes a crosstalk reduction design that can be employed by a semiconductor package to effectively reduce the crosstalk level. In accordance with the proposed crosstalk reduction design, a ground bonding wire coupled between a device ground pad (e.g., a cathode pad of one VCSEL) and a PCB ground pad is formed and configured by the wire bonding process to cross over a signal bonding wire between a device signal pad (e.g., an anode pad of one VCSEL) and a PCB signal trace. In this embodiment, an additional ground bonding wire 118_0 is coupled between the device ground pad GND_0 of the semiconductor component 105_0 and a PCB ground pad 112_0, and crosses over the signal bonding wire 114_0 coupled between the device signal pad SIG_0 of the semiconductor component 105_0 and the PCB signal trace 108_0; an additional ground bonding wire 118_1 is coupled between the device ground pad GND_1 of the semiconductor component 105_1 and a PCB ground pad 112_1, and crosses over the signal bonding wire 114_1 coupled between the device signal pad SIG_1 of the semiconductor component 105_1 and the PCB signal trace 108_1; an additional ground bonding wire 118_2 is coupled between the device ground pad GND_2 of the semiconductor component 105_2 and a PCB ground pad 112_2, and crosses over the signal bonding wire 114_2 coupled between the device signal pad SIG_2 of the semiconductor component 105_2 and the PCB signal trace 108_2; and an additional ground bonding wire 118_3 is coupled between the device ground pad GND_3 of the semiconductor component 105_3 and a PCB ground pad 112_3, and crosses over the signal bonding wire 114_3 coupled between the device signal pad SIG_3 of the semiconductor component 105_3 and the PCB signal trace 108_3. Each of the additional ground bonding wires 118_0-118_0 is capable of providing an additional return path as well as additional EMI shielding. With the help of additional ground bonding wires 118_0-118_0 that cross over signal bonding wires 114_0-114_3, respectively, the crosstalk level of the semiconductor package 100 can be effectively reduced.

Figure 2:
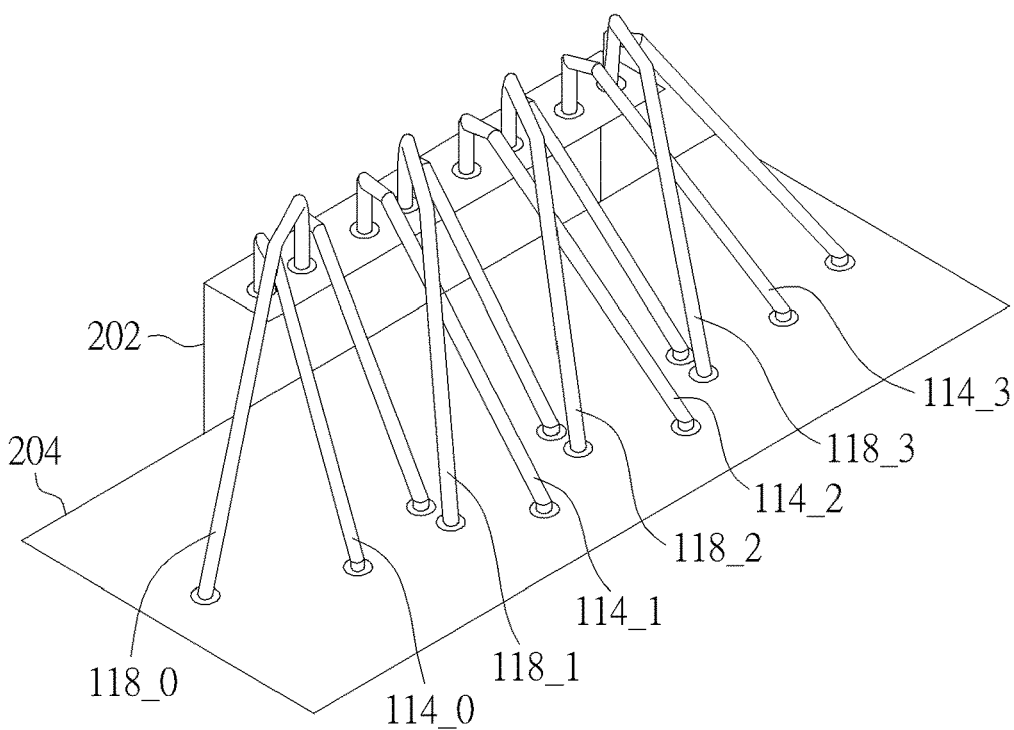
FIG. 2 is a diagram illustrating a crosstalk reduction design employed by the semiconductor package shown in FIG. 1.

Please refer to FIG. 1 in conjunction with FIG. 2. FIG. 2 is a diagram illustrating a crosstalk reduction design employed by the semiconductor package 100 shown in FIG. 1. The additional ground bonding wire 118_0 crosses over the signal bonding wire 114_0 and the additional ground bonding wire 118_1 crosses over the signal bonding wire 114_1, thereby reducing the crosstalk level between the driving signal passing through the signal bonding wire 114_0 and the driving signal passing through the signal bonding wire 114_1. The additional ground bonding wire 118_1 crosses over the signal bonding wire 114_1 and the additional ground bonding wire 118_2 crosses over the signal bonding wire 114_2, thereby reducing the crosstalk level between the driving signal passing through the signal bonding wire 114_1 and the driving signal passing through the signal bonding wire 114_2. The additional ground bonding wire 118_2 crosses over the signal bonding wire 114_2 and the additional ground bonding wire 118_3 crosses over the signal bonding wire 114_3, thereby reducing the crosstalk level between the driving signal passing through the signal bonding wire 114_2 and the driving signal passing through the signal bonding wire 114_3.

Furthermore, the device ground pads GND_0-GND_3 are connected to a common ground plane 202 on the semiconductor device (e.g. VCSEL array) 104. The PCB ground pads 110_0-110_3 and 112_0-112_3 are connected to a common ground plane 204 on the PCB 102. In this embodiment, when the semiconductor device 104 is mounted on the PCB 102, the common ground plane 202 of the semiconductor device 104 has physical contact with the common ground plane 204 of the PCB 102.

The crosstalk reduction design shown in FIG. 1 and FIG. 2 is for illustrative purposes only, and is not meant to be limitations of the present invention. Any crosstalk reduction design using a ground bonding wire that is coupled between a device ground pad and a PCB ground pad and crosses over a signal bonding wire between a device signal pad and a PCB signal trace for crosstalk reduction falls within the scope of the present invention.

5

Figure 3:
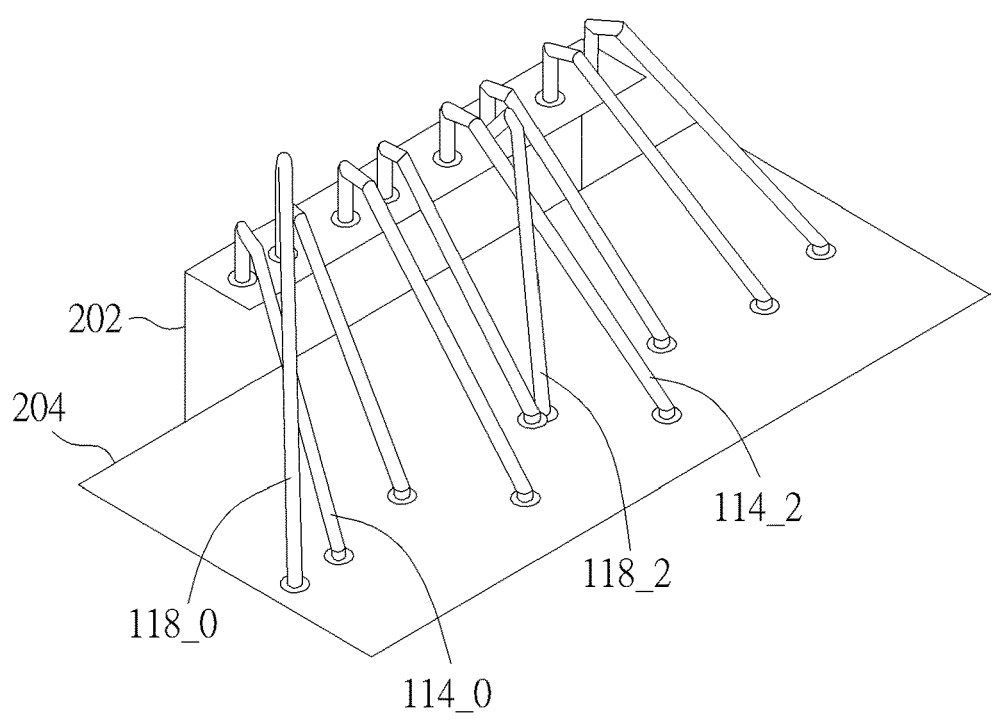
FIG. 3 is a diagram illustrating a first alternative crosstalk reduction design that can be employed by the semiconductor package shown in FIG. 1.

Please refer to FIG. 1 in conjunction with FIG. 3. FIG. 3 is a diagram illustrating a first alternative crosstalk reduction design that can be employed by the semiconductor package 100 shown in FIG. 1. The major difference between the crosstalk reduction designs shown in FIG. 2 and FIG. 3 is that the crosstalk reduction design shown in FIG. 3 omits the additional ground bonding wires 118_1 and 118_3 included in the crosstalk reduction design shown in FIG. 2.

Figure 4:
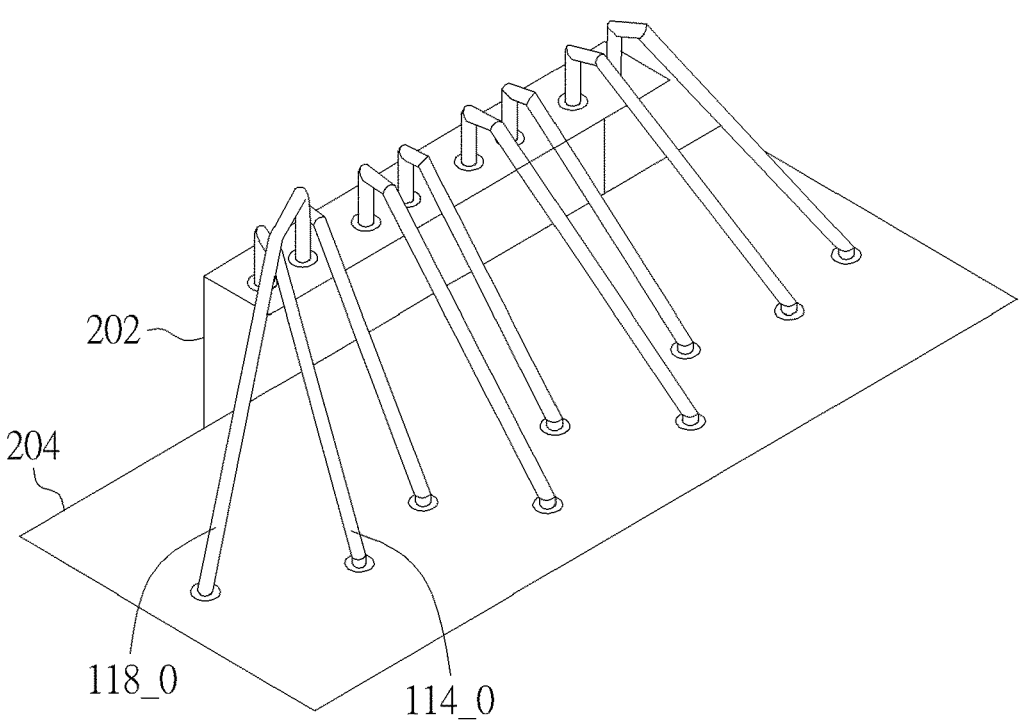
FIG. 4 is a diagram illustrating a second alternative crosstalk reduction design that can be employed by the semiconductor package shown in FIG. 1.

Please refer to FIG. 1 in conjunction with FIG. 4. FIG. 4 is a diagram illustrating a second alternative crosstalk reduction design that can be employed by the semiconductor package 100 shown in FIG. 1. The major difference between the crosstalk reduction designs shown in FIG. 2 and FIG. 4 is that the crosstalk reduction design shown in FIG. 4 omits the additional ground bonding wires 118_1-118_3 included in the crosstalk reduction design shown in FIG. 2.

Figure 5:
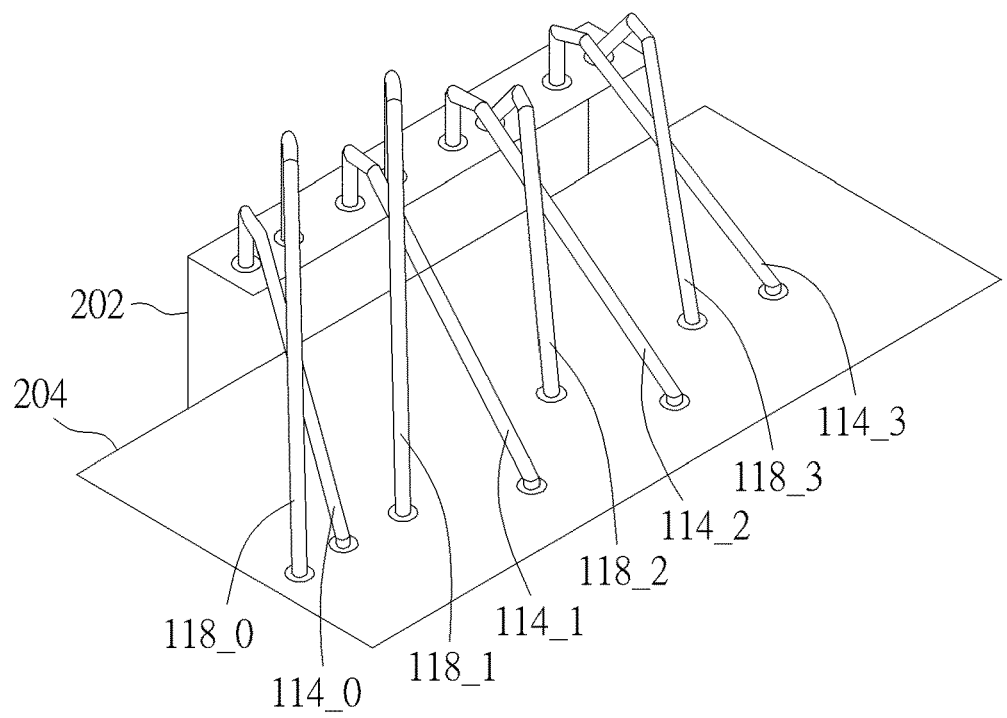
FIG. 5 is a diagram illustrating a third alternative crosstalk reduction design that can be employed by the semiconductor package shown in FIG. 1.

Please refer to FIG. 1 in conjunction with FIG. 5. FIG. 5 is a diagram illustrating a third alternative crosstalk reduction design that can be employed by the semiconductor package 100 shown in FIG. 1. The major difference between the crosstalk reduction designs shown in FIG. 2 and FIG. 5 is that the crosstalk reduction design shown in FIG. 5 omits the ground bonding wires 116_0-116_3 included in the crosstalk reduction design shown in FIG. 2, where none of the ground bonding wires 116_0-116_3 crosses over a signal bonding wire coupled between a device signal pad (e.g., an anode pad of one VCSEL) and a PCB signal trace. Compared to the crosstalk reduction design shown in FIG. 5, the crosstalk reduction design shown in FIG. 2 has better crosstalk reduction performance due to having more ground bonding wires that provide return paths as well as EMI shielding.

Figure 6:
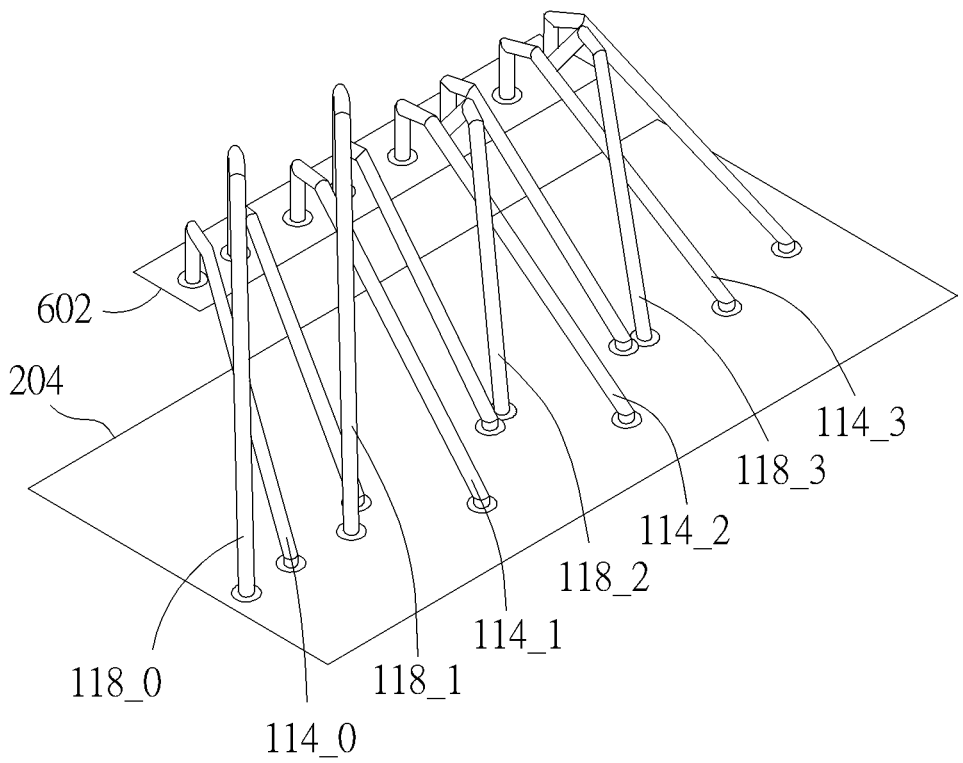
FIG. 6 is a diagram illustrating a fourth alternative crosstalk reduction design that can be employed by the semiconductor package shown in FIG. 1.

Please refer to FIG. 1 in conjunction with FIG. 6. FIG. 6 is a diagram illustrating a fourth alternative crosstalk reduction design that can be employed by the semiconductor package 100 shown in FIG. 1. The major difference between the crosstalk reduction designs shown in FIG. 2 and FIG. 6 is that the crosstalk reduction design shown in FIG. 6 has two common ground planes with no physical contact. Specifically, the device ground pads GND_0-GND_3 are connected to a common ground plane 602 on the semiconductor device (e.g. VCSEL array) 104. The PCB ground pads 110_0-110_3 and 112_0-112_3 are connected to the common ground plane 204 on the PCB 102. In this embodiment, when the semiconductor device 104 is mounted on the PCB 102, the common ground plane 602 of the semiconductor device 104 does not have physical contact with the common ground plane 204 of the PCB 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package comprising:
   a printed circuit board (PCB), comprising a first PCB ground pad and a first PCB signal trace;
   a semiconductor device, comprising a first device ground pad and a first device signal pad;
   a first signal bonding wire, coupled between the first device signal pad and the first PCB signal trace; and
   a first ground bonding wire, coupled between the first device ground pad and the first PCB ground pad, wherein the first ground bonding wire crosses over the first signal bonding wire.

2. The semiconductor package of claim 1, wherein the PCB further comprises a second PCB ground pad, and the semiconductor package further comprises:
   a second ground bonding wire, coupled between the first device ground pad and the second PCB ground pad.

3. The semiconductor package of claim 1, wherein the semiconductor device comprises a plurality of semiconductor components, and both of the first device ground pad and the first device signal pad belong to one of the plurality of semiconductor components.

4. The semiconductor package of claim 1, wherein the PCB further comprises a second PCB ground pad and a second PCB signal trace; the semiconductor device further comprises a second device ground pad and a second device signal pad; and the semiconductor package further comprises:
   a second signal bonding wire, coupled between the second device signal pad and the second PCB signal trace; and
   a second ground bonding wire, coupled between the second device ground pad and the second PCB ground pad, wherein the second ground bonding wire crosses over the second signal bonding wire.

5. The semiconductor package of claim 4, wherein the PCB further comprises a third PCB ground pad and a fourth PCB ground pad, and the semiconductor package further comprises:
   a third ground bonding wire, coupled between the first device ground pad and the third PCB ground pad; and
   a fourth ground bonding wire, coupled between the second device ground pad and the fourth PCB ground pad.

6. The semiconductor package of claim 4, wherein the semiconductor device comprises a plurality of semiconductor components, and both of the first device ground pad and the first device signal pad belong to one of the plurality of semiconductor components, and both of the second device ground pad and the second device signal pad belong to another of the plurality of semiconductor components.

7. The semiconductor package of claim 4, wherein the first PCB ground pad and the second PCB ground pad are connected to a same ground plane on the PCB.

8. The semiconductor package of claim 1, wherein the first PCB ground pad is connected to a ground plane of the PCB, the first device ground pad is connected to a ground plane of the semiconductor device, and the ground plane of the semiconductor device has physical contact with the ground plane of the PCB.

9. The semiconductor package of claim 1, wherein the first PCB ground pad is connected to a ground plane of the PCB, the first device ground pad is connected to a ground plane of the semiconductor device, and the ground plane of the semiconductor device does not have physical contact with the ground plane of the PCB.

10. The semiconductor package of claim 1, wherein the semiconductor device is an optical device.

11. The semiconductor package of claim 10, wherein the optical device is a vertical cavity surface emitting laser (VCSEL) device, the first device signal pad is an anode pad, and the first device ground pad is a cathode pad.

12. The semiconductor package of claim 10, wherein the optical device is a driverless optical device.

13. A method for fabricating a semiconductor package, comprising:
   mounting a semiconductor device on a printed circuit board (PCB), wherein the PCB comprises a first PCB ground pad and a first PCB signal trace, and the semiconductor device comprises a first device ground pad and a first device signal pad; and performing a wire bonding process, comprising:

coupling a first signal bonding wire between the first device signal pad and the first PCB signal trace; and coupling a first ground bonding wire between the first device ground pad and the first PCB ground pad, wherein the first ground bonding wire crosses over the first signal bonding wire.

14. The method of claim 13, wherein the PCB further comprises a second PCB ground pad, and performing the wire bonding process further comprises:

coupling a second ground bonding wire between the first device ground pad and the second PCB ground pad.

15. The method of claim 13, wherein the semiconductor device comprises a plurality of semiconductor components, and both of the first device ground pad and the first device signal pad belong to one of the plurality of semiconductor components.

16. The method of claim 13, wherein the first PCB ground pad is connected to a ground plane of the PCB, the first device ground pad is connected to a ground plane of the semiconductor device, and the ground plane of the semiconductor device has physical contact with the ground plane of the PCB.

17. The method of claim 13, wherein the first PCB ground pad is connected to a ground plane of the PCB, the first device ground pad is connected to a ground plane of the semiconductor device, and the ground plane of the semiconductor device does not have physical contact with the ground plane of the PCB.

18. The method of claim 13, wherein the semiconductor device is an optical device.

19. The method of claim 18, wherein the optical device is a vertical cavity surface emitting laser (VCSEL) device, the first device signal pad is an anode pad, and the first device ground pad is a cathode pad.

20. The method of claim 18, wherein the optical device is a driverless optical device.

* * * * *